United States Patent [19]

Ono et al.

[11] Patent Number: 4,626,961
[45] Date of Patent: Dec. 2, 1986

[54] CONNECTING STRUCTURE OF TERMINAL AREA OF PRINTED CIRCUIT BOARD

[75] Inventors: Yasuichi Ono; Yoshitada Amagishi; Moritoshi Nakamura, all of Miyagi, Japan

[73] Assignee: Alps Electric Co., Ltd., Japan

[21] Appl. No.: 678,982

[22] Filed: Dec. 6, 1984

[30] Foreign Application Priority Data

Dec. 10, 1983 [JP] Japan .............................. 58-189857[U]

[51] Int. Cl.[4] .............................................. H05K 1/11
[52] U.S. Cl. .................................... 361/398; 200/5 A; 361/411; 361/412
[58] Field of Search ................ 361/398, 411, 412, 414; 200/5 A

[56] References Cited

U.S. PATENT DOCUMENTS

| | | | |
|---|---|---|---|
| 2,851,380 | 9/1958 | Berlinghof | 361/411 X |
| 3,538,055 | 11/1970 | Camilleri et al. | 174/117 A |
| 3,772,776 | 11/1973 | Weisenburger | 361/412 X |
| 4,320,573 | 3/1982 | Larson | 200/5 A X |
| 4,368,281 | 1/1983 | Brumett et al. | 174/68.5 X |
| 4,373,124 | 2/1983 | Frame | 200/5 A X |
| 4,433,223 | 2/1984 | Larson et al. | 200/5 A X |
| 4,493,952 | 1/1985 | Kaleida | 361/398 X |
| 4,533,787 | 8/1985 | Anderegg et al. | 361/398 X |

*Primary Examiner*—R. R. Kucia
*Attorney, Agent, or Firm*—Guy W. Shoup

[57] ABSTRACT

A printed circuit board has a terminal area to which the terminal area of a sheet member is electrically connected. The sheet member is bonded to the printed circuit board with a hot-melt adhesive. The layer of the hot-melt adhesive which is formed on the sheet member and does not face the terminal area of the printed circuit board protrudes from the surface of the terminal area of the sheet member. The printed circuit board includes an insulating substrate made from a material containing silicon dioxide. A metal salt that imparts hydrophobicity to the bonded surface of the substrate is added to the layer of the hot-melt adhesive.

12 Claims, 31 Drawing Figures

CONNECTING STRUCTURE OF TERMINAL AREA OF PRINTED CIRCUIT BOARD

FIELD OF THE INVENTION

The present invention relates to a printed circuit board and, more particularly, to the connecting structure of the terminal area of such a printed circuit board.

SUMMARY OF THE INVENTION

It is the main object of the present invention to provide a printed circuit board having a terminal area to which the terminal area of a sheet member can certainly be connected.

Other objects and features of the invention will be apparent from the ensuing description which is taken in conjunction with the accompanying drawings.

DETAILED DESCRIPTION OF THE INVENTION

Figure 1:
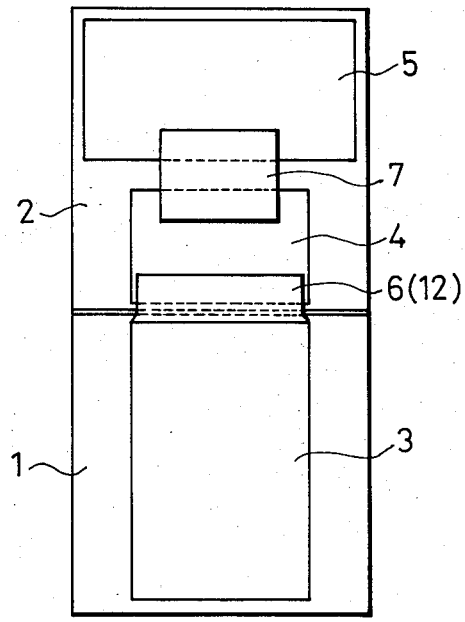
FIG. 1 is a schematic diagram of a portable electronic equipment embodying the present invention.

Referring first to FIG. 1, a portable electronic equipment such as an electronic game apparatus or desktop calculator to which the present invention is applied is schematically shown. This equipment consists of a lower case 1 and an upper case 2 such that the equipment can be folded. A membrane switch 3 serving as an input device is housed in the lower case 1. Housed in the upper case 2 are a printed circuit board 4 on which electronic parts and the like are mounted and a liquid crystal display 5. The switch 3 is connected to the circuit board 4 through a heat seal connector 6 that is integral with the switch 3. Similarly, the liquid crystal display 5 is connected to the circuit board 4 by a heat seal connector 7. The structure of this electronic unit and the process for manufacturing it are hereinafter described with reference to FIGS. 2-10.

Figure 2:
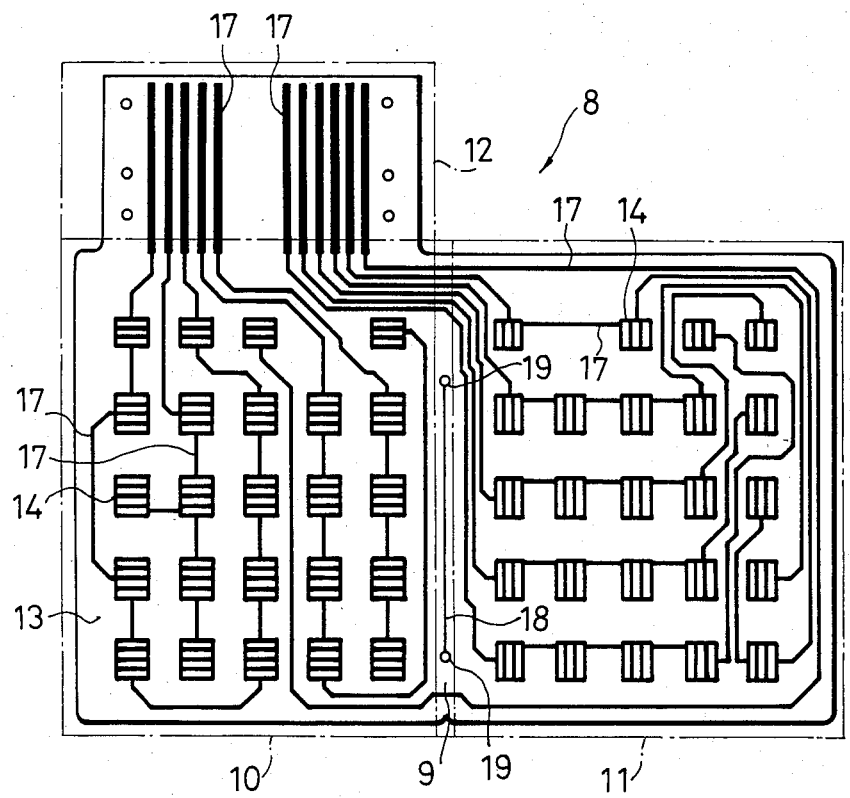
FIG. 2 is a plan view of an electrode structure for the electronic equipment shown in FIG. 1.

Referring next to FIG. 2, there is shown an electrode structure 8 for the membrane switch. The heat seal connector 6 is formed integrally with this structure 8, which is composed of a bent-back portion 9 extending longitudinally and disposed substantially in the center of the structure 8, a lower electrode portion 10 disposed on the left side of the bent-back portion 9 as viewed in the page, an upper electrode portion 11 disposed on the right side of the bent-back portion 9, and a connecting lug 12 extending from one end of the lower electrode portion 10. The bent-back portion 9, the lower and upper electrode portions 10 and 11, and the lug 12 are connected together on a base film 13 which is made from an electrically insulating and flexible synthetic resin, such as polyester, polyimide or polyamide.

A number of filmy electrodes 14 are printed in arrayed manner at positions symmetrical with respect to a straight line on each of the lower electrode portion 10 and the upper electrode portion 11. As can be seen from FIG. 10, each filmy electrode 14 consists of a thin layer 15 of silver first printed on the base film 13 and a thin layer 16 of carbon spread on the silver layer 15. As shown in FIG. 2, each filmy electrode 14 is substantially rectangular in two dimensional shape. Each electrode 14 on the lower electrode portion 10 has horizontal stripes, whereas each electrode 14 on the upper electrode 11 has vertical stripes. These horizontal and vertical stripes cross each other at positions where the upper and lower electrodes 14 are in contact with each other. This makes the contact between the upper and lower electrodes 14 certain, and can render the quantity of silver and carbon used as small as possible.

The electrodes 14 on the lower electrode portion 10 and the upper electrode portion 11 are connected together by a plurality of filmy, thin and electrically conductive layers 17. One end of each conductive layer 17 extends into the connecting lug 12 to form the terminal area of the electrode, but it terminates in a position close to the fringe of the lug 12 (base film 13), i.e., it does not reach the fringe of the lug. Similarly to the electrodes 14, each conductive layer 17 consists of a thin layer 15 of silver printed on the base film 13 and a thin layer 16 of carbon overlying the silver layer 15. Thus, the electrodes 14 and the conductive layers 17 are formed at the same time on the same plane of the base film 13.

A cut 18 is formed substantially in the center of the bent-back portion 9 along an imaginary bent-back line. One end of the cut 18 does not extend to the fringe of the base film on the same side, and the other end does not reach the conductive layers 17 that extend across the bent-back line. Holes 19 extending through the base film 13 are formed on both ends of the cut 18 to prevent the cut 18 from producing splits. The holes may take various forms such as circular, elliptical, triangular, and rectangular forms.

Figure 3:
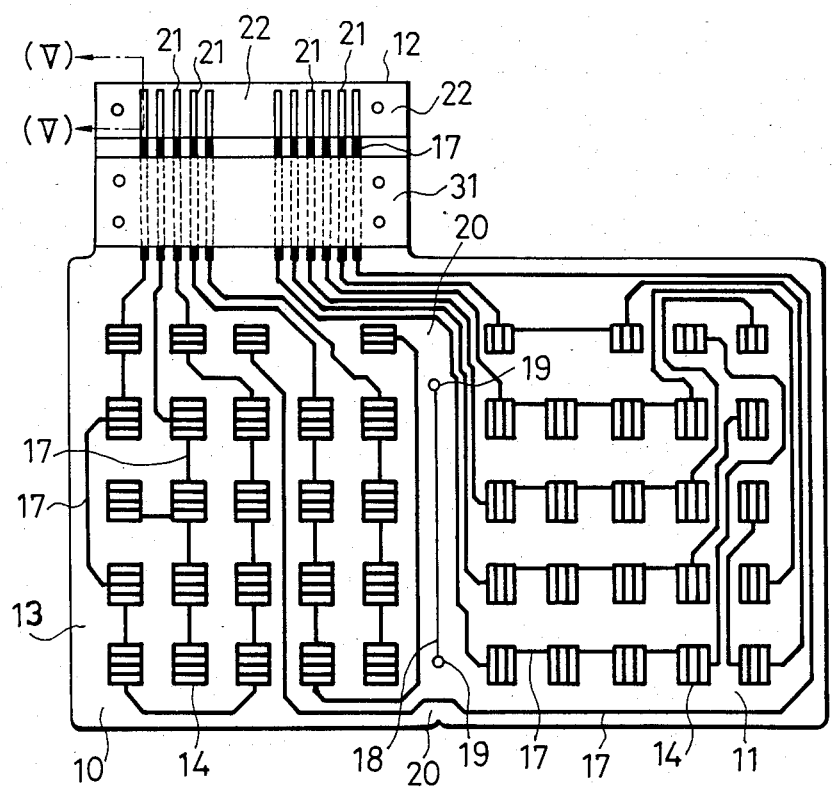
FIG. 3 is a plan view of an electrode structure in which hot-melt adhesive layers and a protective layer are formed in position.

Accordingly, narrow connecting portions 20 are left between the both ends of the cut 18 and their respective fringes of the base film 13, as shown in FIG. 3. The connecting portions 20 and the cut 18 facilitate folding the electrode structure 8. Such folding would raise the possibility that stress is produced inside the connecting portions 20 thereby to create a split from the side of the cut 18 toward either fringe of the base film 13, cutting off portions of the conductive layers 17. This possibility is circumvented by the aforementioned holes 19 on the opposite sides of the cut 18. The holes 19 function well especially when they are circular or elliptical in shape.

Figure 4A:
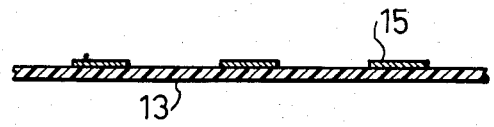
FIGS. 4(a)-4(d) are cross-sectional views of the electrode structure shown in FIG. 3, for illustrating the sequence of steps, to form a connecting lug.
Figure 4B:
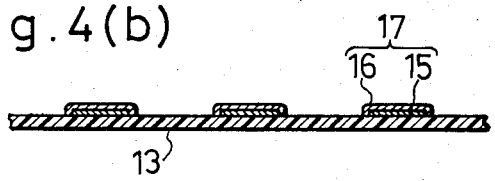
Figure 4C:
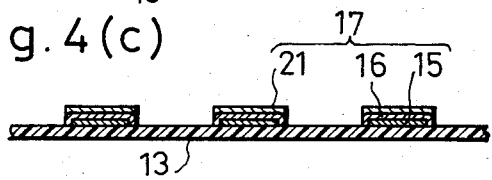
Figure 4D:
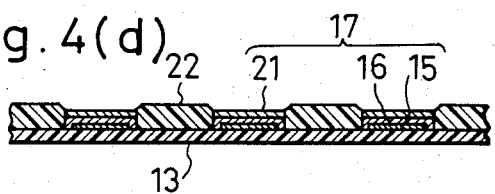
Figure 5:
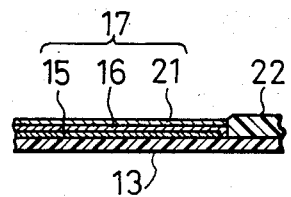
FIG. 5 is an enlarged cross section taken along the line V—V of FIG. 3.

The structure of the connecting lug 12 is next described by referring to FIGS. 4(a)-4(d). First, the layers 15 of silver are printed on the base film 13 as mentioned previously (see FIG. 4(a)). Then, the layers 16 of carbon are formed on the silver layers 15 by printing, as shown in FIG. 4(b). Subsequently, an electrically conductive hot-melt adhesive layer 21 is printed on each carbon layer 16 so as to form a portion of the conductive layer 17, as shown in FIG. 4(c). Thereafter, a layer 22 of an electrically insulating hot-melt adhesive is formed on the uncovered area of the base film 13, i.e., the areas between the successive conductive layers 17 and the areas between the ends of the conductive layers 17 and the fringe of the film 13, as shown in FIGS. 4(d) and 5. The adhesive layer 22 is so formed by printing into a thick film as to slightly protrude from the surface of each adhesive layer 21.

It is to be noted that the adhesive layers 21 and 22 are not formed on the whole surface of the connecting lug 12, but rather they are formed on an area of a given width on the front side of the lug 12, as shown in FIG. 3. The lug 12, namely the electrode structure 8, is bonded to the printed circuit board 4 (described later) by means of these adhesive layers 21 and 22.

The layers 21 of the conductive hot-melt adhesive are formed by applying a paint including a high-molecular thermoplastic coupling agent, an organic solvent, and electrically conductive fine particles by printing or other means. If necessary, the paint can contain a tackiness agent, a filler, and other materials. Similarly, the layer 22 of the electrically insulating hot-melt adhesive is formed by applying a paint including a high-molecular thermoplastic coupling agent, an organic solvent, and a hydrophobicity-imparting compound (described later). The paint can further include a tackiness agent, a filler, and other materials, if necessary.

The high-molecular thermoplatic coupling agent consists of one or more agents exhibiting a good resistance to moisture such as ethylene-vinyl acetate copolymer, polyester resin, polyamide resin, polymethylmethacrylate resin, and chloroprene rubber. Preferably, this coupling agent accounts for approximately 5 to 65% by weight of the paint.

The organic solvent described above evaporates almost completely at a temperature of approximately 120° to 200° C. Organic liquids having a low boiling point such as toluene, isophorone, benzyl alcohol, Carbitol, Carbitol acetate, decalin, acetophenone can be used. Preferably, this organic solvent accounts for approximately 25 to 65% by weight of the paint.

The conductive fine powder described above consists of fine powder of carbon, such as graphite or carbon black, or fine powder of a metal, such as silver. Preferably, this fine powder accounts for approximately 30 to 60% by weight of the paint.

Examples of the aforementioned compound that imparts hydrophobic nature include plasticizer of DOP, ester resins, terpene resins, aliphatic resins, and phenol resins. Preferably, this compound accounts for about less than 20% by weight of the paint.

Examples of the above-mentioned filler include titanium oxide and silicon oxide. Preferably, the filler accounts for approximately less than 25% by weight of the paint.

The insulating substrate 23 used in the printed circuit board 4 usually consists of glass, ceramic, or composite material of glass and epoxy resin. Since these materials contain silicon dioxide, it is possible that a sufficient adhesive strength is not obtained when a hot-melt adhesive is employed. Especially under humid condition, the adhesive strength deteriorates greatly, resulting in the adhesive peeling away from the surface of the insulating substrate 23.

Figure 13:
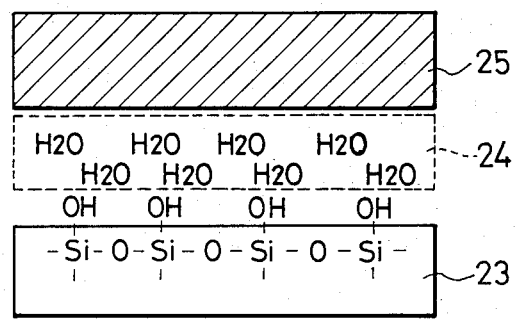
FIG. 13 shows the manner in which a layer of water is formed between an insulating substrate and ordinary adhesive.

This phenomenon is understood in the manner described below. Referring to FIG. 13, the silanol group Si—OH existing on the surface of the insulating substrate 23 made from glass, ceramic or composite material of glass and epoxy resin that contains silicon dioxide is hydrophilic. Under a humid condition, this silanol group adsorbs a water molecule $H_2O$. Then, another water molecule associates with the adsorbed water molecule. As a result, a layer 24 of water forms on the surface of the insulating substrate 23. This water layer 24 that is formed at the interface between the insulating substrate 23 and the hot-melt adhesive 25 accelerates peeling of the adhesive 25 off the substrate 23.

To avoid this undesirable situation, the compound giving a hydrophobic nature is added to the hot-melt adhesive layer 22. Specifically, this compound is chemically coupled to the oxygen of the silanol group Si—OH existing on the bonded surface of the insulating substrate 23 to impart hydrophobicity to the bonded surface. Examples of the compound giving hydrophobic property include metal salts, metal oxides, coupling agents, isocyanate compounds, and Lewis bases. More specifically, the metal salts include nickel chloride and ammonium molybdate. The metal oxides include chromium oxide. Examples of the coupling agents are coupling agents including silane such as methyl chlorosilane, phenyltrichlorosilane, γ-aminopropyltriethoxysilane and trichlorosilane, and coupling agents including titanium. Preferably, the hydrophobicity-imparting compound accounts for approximately 0.1 to 25% by weight of the paint.

Figure 14A:
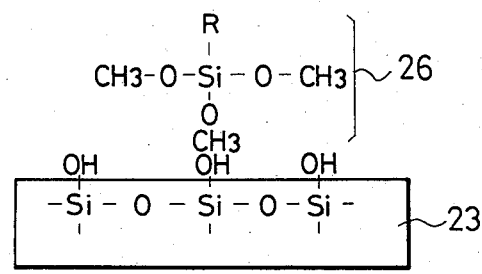
FIGS. 14(a) and 14(b) show the conditions before and after silanol group on the surface of an insulating substrate reacts with the coupling agent of silane included in adhesive, respectively.
Figure 14B:
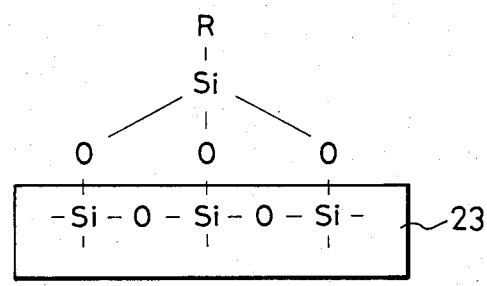
Figure 15A:
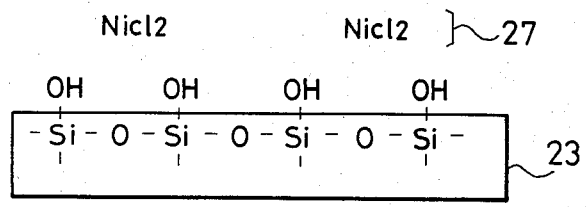
FIGS. 15(a) and 15(b) show the conditions before and after silanol group on the surface of an insulating substrate reacts with nickel chloride included in adhesive, respectively.
Figure 15B:
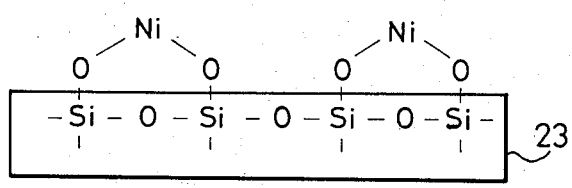
Figure 16:
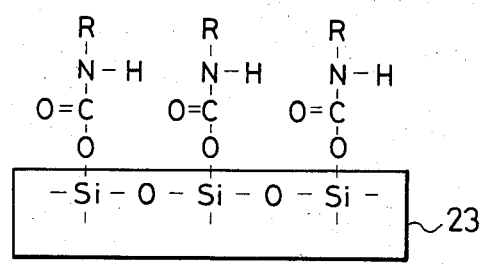
FIG. 16 shows the condition in which silanol group on the surface of an insulating substrate has undergone reaction with an isocyanate compound included in adhesive.
Figure 17:
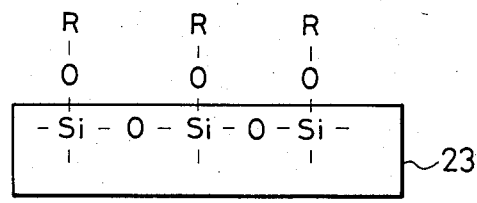
FIG. 17 shows the condition in which OH terminal group of polyester has been caused to react with silanol group by addition of a Lewis base.

FIGS. 14(a) and 14(b) respectively show the conditions before and after the silanol group Si—OH on the surface of the insulating substrate 23 made from glass reacts with coupling agent 26, which includes silane and exists in the adhesive. FIGS. 15(a) and 15(b) respectively shows the conditions before and after the silanol group Si—OH on the surface of the insulating substrate 23 reacts with nickel chloride (metal salt) 27 included in the adhesive. FIG. 16 shows the condition in which the silanol group Si—OH on the surface of the insulating substrate 23 has reacted with an isocyanate compound included in the adhesive. FIG. 17 shows the manner in which addition of a Lewis base has caused the end group OH of polyester to react with silanol group Si—OH.

As can be seen from these figures, by pressing the hot-melt adhesive against the surface of the insulating substrate 23 at a high temperature, the hydrophobicity-imparting compound included in it is chemically strongly coupled to the oxygens of the silanol group existing on the surface of the substrate, so that the surface of the substrate 23 exhibits hydrophobicity. Consequently, even under a humid condition, the water layer 24 is not formed between the insulating substrate 23 and the adhesive 25, as shown in FIG. 13, resulting in a high adhesive strength.

An example of the composition of the hot-melt adhesive is given below.

EXAMPLE 1

Two hundred parts by weight of a high-molecular thermoplastic coupling agent, 100 parts by weight of a polyester resin, 300 parts by weight of an organic solvent, and 4 parts of a hydrophobicity-imparting compound were metered and mixed by means of a stirrer. A chloroprene rubber which was manufactured by Showa Highpolymer Co., Ltd., Japan, under the product name Vinylol 2200 was used as the thermoplastic coupling agent. A polyester resin which was manufactured by Bostik Japan Ltd. under the product name 7662 was used as the above-described polyester resin. Isophorone was employed as the organic solvent. A coupling agent containing silane which was prepared by Shin-etsu Chemical Industry Co., Ltd, Japan, under the product name X-12-413 was used as the hydrophobicity-imparting compound. The mixing operation was carried out for four hours.

The paint prepared in this way was forced through a 200-mesh screen made of stainless steel onto a polyester film measuring 50 mm by 50 mm to form a pattern having dimensions of 40 mm by 10 mm by screen printing. Then, the pattern was dried at a temperature of 120° C. for 5 minutes to form a layer of the hot-melt adhesive having a thickness of approximately 20 μm. Thereafter, the polyester film was placed on a slide glass having dimensions of 25 mm by 76 mm by 1.2 mm in such a way that adhesive layer was sandwiched between the glass and the film. Then, the film was pressed on the slide glass with a pressure of 15 Kg/cm$^2$ at a high temperature of 180° C. for 8 seconds, whereby the film was bonded to the slide glass.

Figure 18:
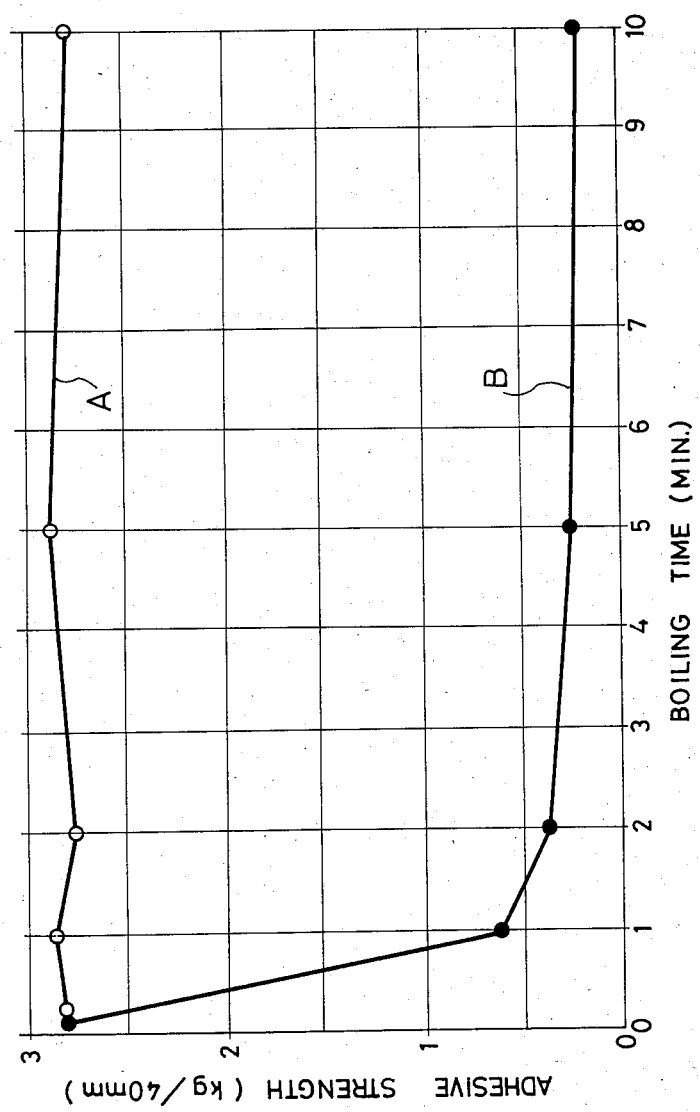
FIGS. 18, 20 and 21 are graphs showing the characteristics of adhesive strength of a polyester film bonded with various adhesives.
Figure 19:
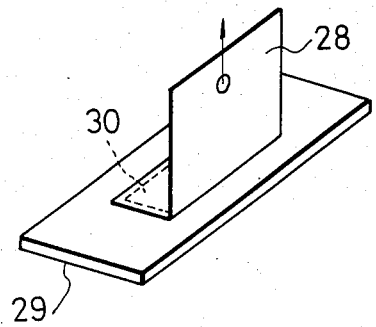
FIG. 19 is a perspective view of a film of polyester bonded to a slide glass, for showing a peel test.

FIG. 18 shows the characteristic of the adhesive strength (curve A) of the hot-melt adhesive produced by Example 1 above in comparison with that (curve B) of a hot-melt adhesive having the same composition except that a coupling agent containing silane is not added. This peel test was carried out in the manner described below. After the polyester films were bonded, the bonded laminates were boiled for 1, 2, 5, and 10 minutes. Then, water was fully wiped away, and they were allowed to stand under normal temperature and humid condition for 15 minutes. Subsequently, the unbonded portion of each polyester film 28 was caused to stand upright on he slide glass 29 as shown in FIG. 19, and then it was pulled by a spring balance (not shown) toward the direction indicated by the arrow shown to measure the adhesive strength of the adhesive layer 30.

As can be seen from FIG. 18, the adhesive strength of the hot-melt adhesive indicated by the curve B decreased by a factor of about six after it was boiled for 1 minute. The adhesive strength decreased further as time elapsed. On the other hand, the hot-melt adhesive produced according to Example 1 showed substantially no change in adhesive strength after it was boiled. Thus, the novel adhesive exhibits a high adhesive strength at all times.

EXAMPLE 2

Five hundred parts by weight of a high-molecular thermoplastic coupling agent, 250 parts by weight of a polyester resin, 400 parts by weight of an organic solvent, 12 parts by weight of a hydrophobicity-imparting compound, 15 parts by weight of a plasticizer, and 12 parts by weight of a filler were metered and blended to produce a paint. A chloroprene rubber which was produced by Showa Highpolymer Co., Ltd., Japan, under the product name Vinylol 2202 was used as the thermoplastic coupling agent. A polyester resin which was manufactured by Bostik Japan Ltd. under the product name 7662 was used as the above-described polyester resin. Isophorone was utilized as the organic solvent. The hydrophobility-imparting compound consisted of nickel chloride. The plasticizer consisted of DOP. Titanium oxide was used as the filler.

This paint was passed through a 200-mesh screen made of stainless steel onto a polyester film measuring 50 mm by 50 mm to form a pattern having dimensions of 40 mm by 10 mm by screen printing, in the same way as Example 1. Then, the pattern was dried at a temperature of 120° C. for 5 minutes to form a layer of the hot-melt adhesive having a thickness of approximately 20 μm. Thereafter, this film of polyester was put on a slide glass having dimensions of 25 mm by 76 mm by 1.2 mm such that the adhesive layer was sandwiched between the film and the glass. Then, a pressure of 15 Kg/cm$^2$ was applied to this sandwich for 6 seconds while it is heated to a temperature of 170° C., in order to bond the film to the glass.

Figure 20:
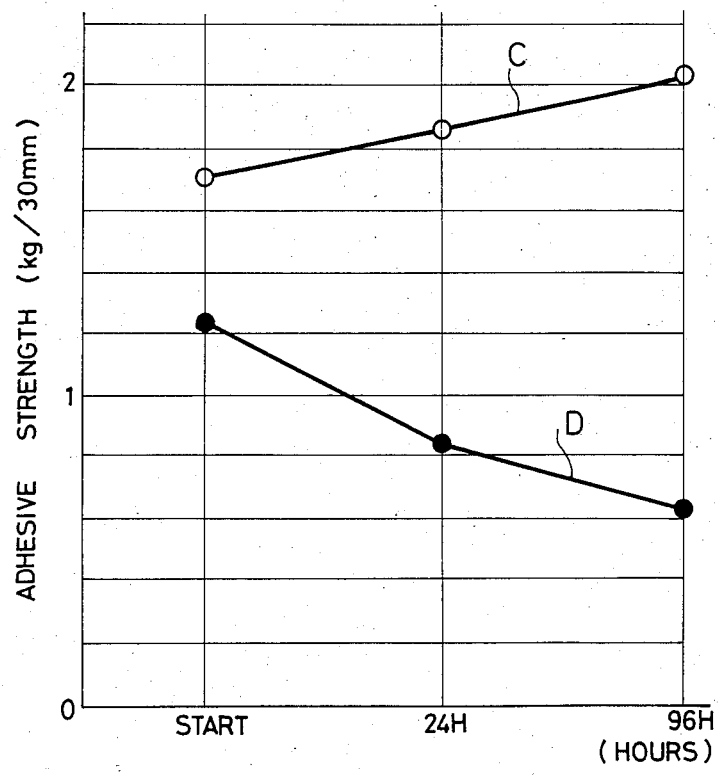

FIG. 20 shows the characteristic of the adhesive strength (curve C) of the hot-melt adhesive obtained according to Example 2 against that (curve D) of a hot-melt adhesive which has the same composition as the former adhesive except that nickel chloride was not added. The peel test was conducted under the condition that the temperature was 65° C. and the humidity was 95%.

This graph reveals that the adhesive strength of the adhesive indicated by the curve D decreased gradually with the passage of time under the aforementioned condition of high temperature and high humidity, while the novel adhesive retained its large adhesive strength even in such a condition.

As mentioned previously, the base film 13 of the electrode structure 8 (the connecting lug 12) consists of polyester, and the insulating substrate used in the printed circuit board 4 is made from glass, ceramic, or composite material of glass and epoxy resin. In this case, if a chloroprene rubber and a polyester resin are used together as shown in Examples 1 and 2 as the high-molecular thermoplastic coupling agent for the hot-melt adhesive layer 22 that serves to bond the film to the substrate, then the film will adhere quite well. Preferably, a polyester resin is used as the high-molecular thermoplastic coupling agent, taking into account the adhesion of the conductive hot-melt adhesive layers 21 to the layer 22 of the insulating hot-melt adhesive, sometimes also the adhesion of it to the base film 13 of polyester.

Figure 6:
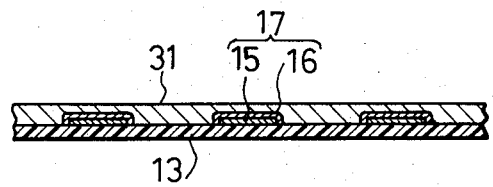
FIG. 6 is an enlarged cross section of the connecting lug on which a protective film is formed.

Referring again to FIG. 1, when the upper case 2 is moved relative to the lower case 1 to open and close the enclosure of the electronic equipment, a portion of the heat seal connector 6, namely the connecting lug 12, is repeatedly bent. Accordingly, as shown in FIG. 3, the bent portion of the lug 12 is provided with an electrically insulating, elastic protective film 31 which overlies the conductive layers 17 and the base film 13 as shown in FIG. 6. Thus, no splits will be formed in the filmy conductive layers 17 in spite of the repeated bending as described above. Further, the protective film 31 prevents the conductive layers 17 from peeling off from the base film 13.

Preferably, the protective film 31 is made from a material resembling rubber such as silicone elastomer. If epoxy resin or similar material were used for the protective film 31, the film would be hardened by a drying step which is performed after an application step. Then, the film 31 would not have elasticity. This would obstruct the bending of the connecting lug 12. Further, if the protective film 31 is bent repeatedly, splits would be produced in the film 31. In addition, the film 31 might peel off together with conductive layers 17. Consequently, the protective film 31 would not exhibit its property. On the other hand, the protective film 31 according to the present invention is elastic and so the lug 12 is free to bend. Since the film 31 yields well to the bending operation, no splits will form in the film 31, sufficiently contributing to the protection of the conductive layers 17.

Silicone elastomers which are produced by vulcanizing the prepolymer of a polysiloxane having a reactive terminal group, such as Si—OH, Si—OR, Si—H, or Si—CH=CH$_2$, at room temperature under the presence of a catalyst are three-dimensional elastic substances having cross-linked and lengthened molecular chains. These elastomers are adapted for the protective film 31.

One preferred example of the silicone paint which is used to form the protective film 31 consists of 80 parts by weight of tacky silicone elastomer to which a catalyst is added, 20 parts by weight of a silicone elastomer of a low viscocity, and 10 parts by weight of a curing agent for the tacky silicone elastomer. An elastomer which is manufactured by Toray Silicone Industry Ltd., Japan, under the product name SE1700 is used as the tacky silicone elastomer. An elastomer that is produced by Toray Elatomer Industry Ltd. under the product name CY52-005 is employed as the silicone elastomer of the low viscocity. This paint is a solventless paste which has been produced by adding the silicone elastomer of the low viscosity to the tacky silicone elastomer to permit a good screen printing. A thick film can be formed from this paint. The protective film 31 that is flexible and elastic is formed by applying this paint to the connecting lug 12 in predetermined positions by printing and then heating it at a temperature of 150° C. for 10 to 15 minutes.

Figure 21:
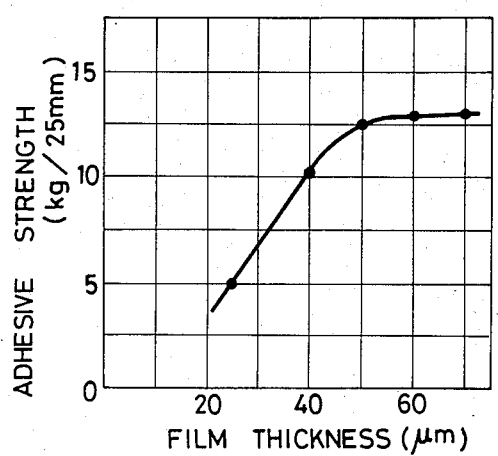

The adhesive strength required to pull the protective film 31 formed in this manner away from the base film 13 of polyester is as large as 16 Kg/cm$^2$ when measured in accordance with JIS (Japanese Industrial Standard) A5755. Also, the shear strength of the film 31 bonded to the base film 13 is as large as 30 Kg/cm$^2$ when measured in accordance with JIS K6801. FIG. 21 is a graph showing the relation of the adhesive strength of the protective film 31 on the base film 13 to the thickness of the film 31 when measured in accordance with JIS S6040. The adhesive strength is given in Kg/25mm. As can be understood from this graph, the thickness of the film 31 is preferably in excess of 40 $\mu$m, more preferably of the order of 50 to 70 $\mu$m.

Referring back to FIG. 3, the membrance switch 3 has the connecting lug 12 on which the layers 21 and 22 of hot-melt adhesive and the protective film 31 are formed. Then, a spacer 32 is stuck to the surface of either the lower electrode portion 10 or the upper electrode portion 11. In the present example, the spacer is stuck to the lower electrode portion 10.

Figure 7:
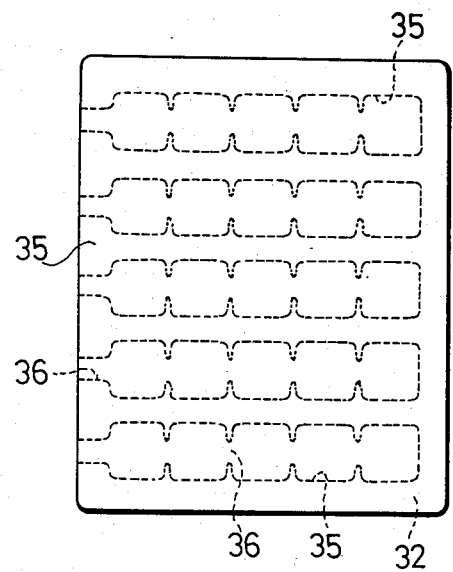
FIG. 7 is a plan view of a composite of a spacer and release paper.
Figure 8:
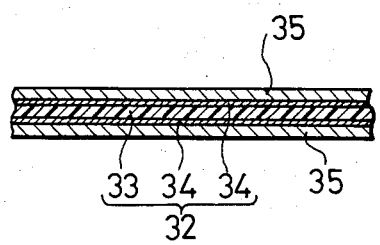
FIG. 8 is an enlarged cross section of the composite shown in FIG. 7.

Referring to FIGS. 7 and 8, there is shown the spacer 32 sandwiched between two sheets of release paper 35. As shown in FIG. 8, the spacer 32 is composed of a base sheet 33 and adhesive layers 34 formed on opposite sides of the base sheet 33. The two sheets of release paper 35 are stuck to the adhesive layers 34.

Figure 9:
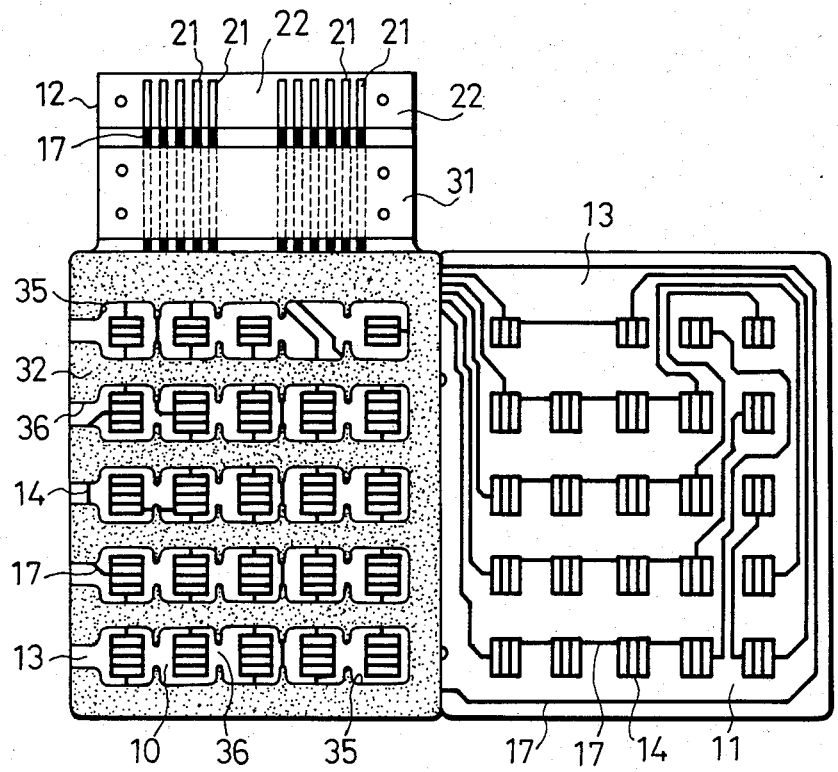
FIG. 9 is a plan view of an electrode structure to which a spacer is stuck.

As shown in FIGS. 7 and 9, the spacer 32 is provided with hollow portions 35 which are opposite to and somewhat larger than the filmy electrodes 14. Further, the spacer 32 is formed with grooves 36, which extend to one end of the spacer 32 and place the successive hollow portions 35 in communication with one another, to allow air to escape. The two sheets of release paper 35 are removed from the spacer 32, and then they are stuck to the lower electrode portion 10, as shown in FIG. 9, in such a way that the openings of the grooves 36 do not face the aforementioned bent portion 9. Thus, the electrodes 14 in the lower electrode portion 10 are exposed through the hollow portions in the spacer 32, but the conductive layers 17 are almost totally covered by the electrically insulating spacer 32. Then, the upper electrode portion 11 is bent over the spacer 32 such that the electrode portions 10 and 11 are connected together by the filmy spacer 32, thus forming the thin membrane switch 3.

Figure 10:
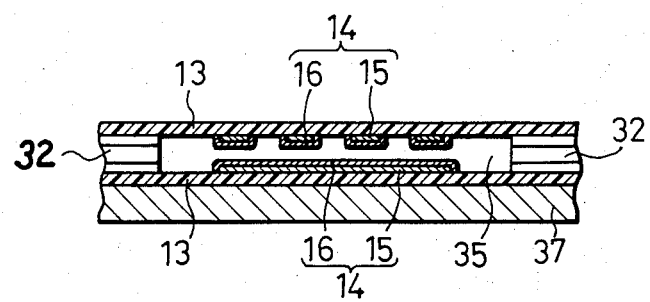
FIG. 10 is an enlarged cross section of opposed upper and lower electrodes.

FIG. 10 shows the manner in which the upper and lower electrodes 14 are opposed to each other inside the hollow portion 35, and a certain gap is left therebetween by the interposition of the spacer 32. A hard support plate 37 is made of a metal or synthetic resin. When a force is applied to the upper electrode portion 14 from above, the upper base film 13 bends, bringing one of the upper electrodes 14 into contact with the lower electrode 14. Hence, the associated closed loop is formed, producing a corresponding signal.

If the hollow portions 35 were not in communication with the air escape grooves 36 but rather almost sealed, when the upper electrode is depressed for entry of data, the air inside the hollow portions 35 would be compressed, leading to an increase in the internal pressure. This would make the contact between the upper and lower electrodes 14 uncertain. That is, input operation would not be certainly performed. In the novel switch, however, such an undesirable situation does not take place on account of the air escape grooves 36, which are in communication with the hollow portions 35 and extend to one end of the spacer 32. Consequently, input operation is carried out in a reliable manner.

Figure 11:
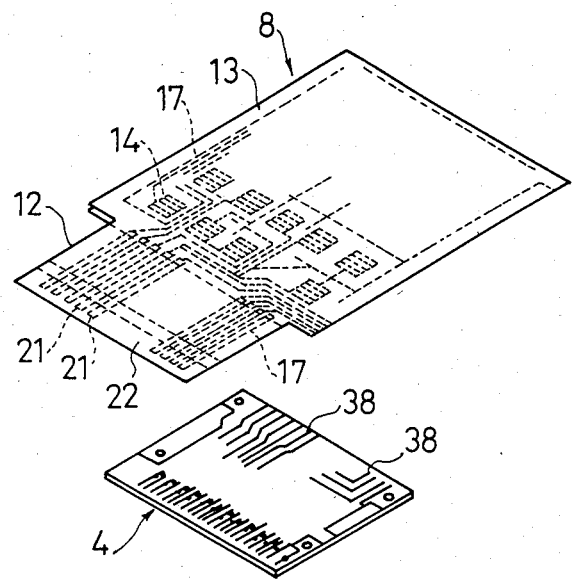
FIG. 11 is a schematic perspective view of an electrode structure and a printed circuit board before the electrode structure is bonded to the circuit board.
Figure 12A:
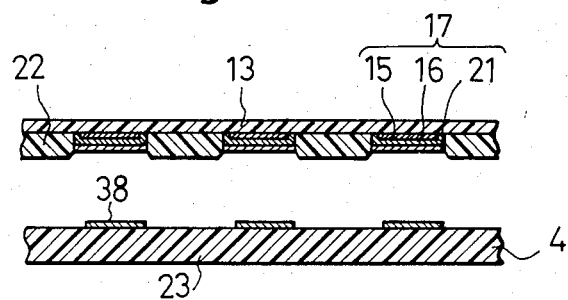
FIGS. 12(a) and 12(b) are enlarged cross sections of an electrode structure and a printed circuit board before and after the electrode structure is bonded to the circuit board, respectively.
Figure 12B:
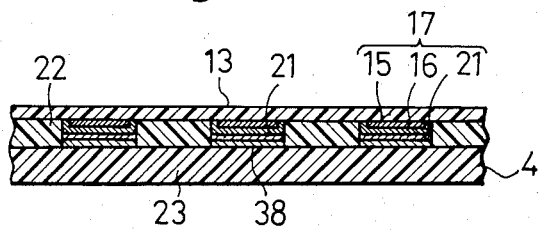

The electrode structure 8 which consists of the lower electrode portion 10 and the upper electrode portion 11 stacked on each other and joined together is next bonded to the printed circuit board 4. FIGS. 11 and 12(a) show the condition of the structure 8 and the circuit board 4 before the structure 8 is bonded to the board. FIG. 12(b) shows the condition in which the electrode structure 8 has been bonded to the printed circuit board 4.

The insulating substrate 23 used in the printed circuit board 4 consists of glass, ceramic, composite of glass and epoxy resin, or other material, and contains silicon dioxide. An electrically conductive filmy layer 38 having a predetermined pattern is formed on the substrate 23, and is made from copper, for example. Electronic parts (not shown) necessary for the switch are installed on the substrate 23.

As shown in FIGS. 11 and 12(a), the electrode structure 8 is turned upside down, and the connecting lug 12 of the structure 8 is placed on the printed circuit board 4 to bring the layer 21 of the conductive hot-melt adhesive into contact with the terminal area of the conductive layer 38 of the board 4. Then, a pressure is applied to the lug 12 under the condition of a high temperature to melt the layers 21 and 22 of the hot-melt adhesive. As the adhesive is cooled, the electrode structure 8 is bonded to the circuit board 4. This state is shown in FIG. 12(b). Since the adhesive layer 21 and the printed circuit board 4 are fused together, the conductive layer 38 of the board 4 is electrically connected to the conductive layers 17, i.e., the silver layers 15, the carbon layers 16, and the conductive hot-melt adhesive layers 21 of the electrode structure 8.

Figure 22A:
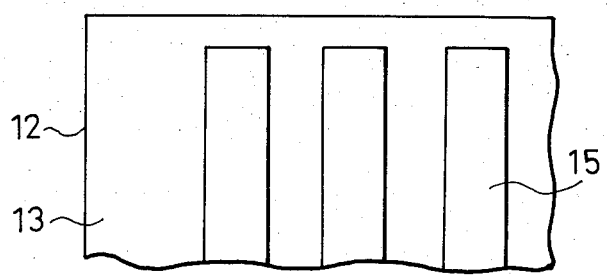
FIGS. 22(a)-22(d) fragmentary enlarged plan view of another connecting lug, for showing the sequence of steps to form it.
Figure 22B:
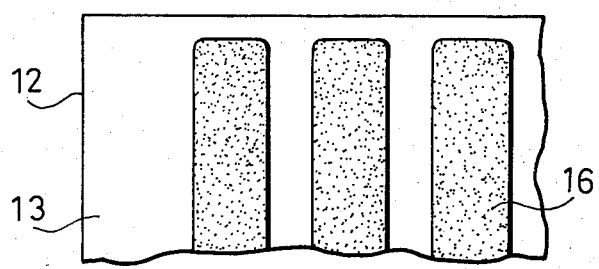
Figure 22C:
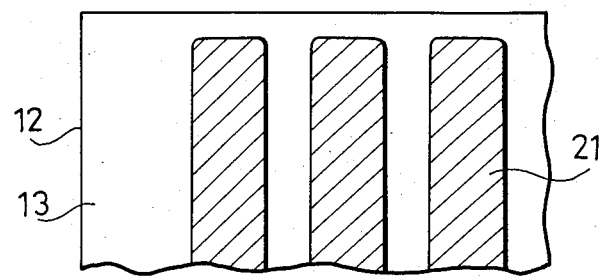
Figure 22D:
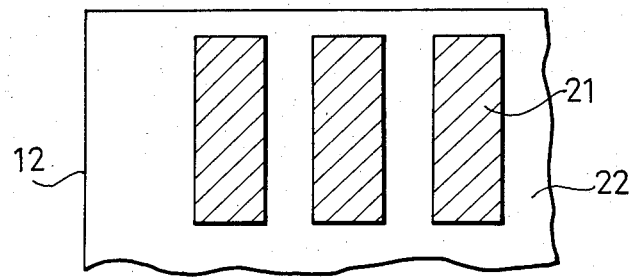

FIGS. 22(a)–22(d) show a modified example of the connecting lug 12 that is a heat seal connector. As shown in FIG. 22(a), layers 15 of silver stripes are formed on the base film 13 of polyester. Then, layers 16 of carbon are formed on the silver layers 15 such that the silver layers 15 are covered, as shown in FIG. 22(b). Subsequently, layers 21 of an electrically conductive hot-melt adhesive are formed on the carbon layers 16, as shown in FIG. 22(c). Thereafter, a layer 22 of an electrically insulating hot-melt adhesive is so formed as to cover the surface of the base film as well as the surface of each adhesive layer 21 that is not involved in adherence.

The surface of the adhesive layer 22 protrudes from the surfaces of the adhesive layers 21 in the same way as the foregoing example. Further, the adhesive layer 22 covers the surfaces of the conductive hot-melt adhesive layers 21, and serves as an insulating and protective film for the layers 21. Therefore, even if an electrically conductive member such as a metal plate comes into contact with the connecting lug 12, it is unlikely that a portion of one conductive layer 17 consisting of the silver layer 15, the carbon layer 16, and the conductive hot-melt adhesive layer 21 is electrically shorted to another portion of the same conductive layer 17.

As already described, by forming the carbon layers 16 to cover the silver layers 15, the silver layers 15 are prevented from becoming sulfurized. Further, migration of the silver is prevented. In addition, by forming electrically highly conductive layers such as the silver layers 15 and the carbon layers 16 inside the conductive hot-melt adhesive layers 21, increase in the internal resistance due to the adhesive layers 21 is lessened. Hence, good electrical connection is made.

In the present invention, the conductive layers 38 of the printed circuit board 4 are not simply pressed on the conductive layers 17 of the electrode structure 8, but rather they are bonded together by means of the conductive hot-melt adhesive layer 21 to render the electrical connection more certain. The conductive fine particles which do not contribute to the adhesion is added to the conductive hot-melt adhesive layers 21 and so the layers 21 do not provide a sufficient adhesive strength by themselves. For this reason, in the present example, the layer 22 of the conductive hot-melt adhesive that does not contain conductive fine particles is formed on opposite sides of the adhesive layers 21. This effectively prevents the conductive hot-melt adhesive layers 21 from peeling off.

In the structure shown in FIG. 5, the conductive layers 17 do not extend to one end of the connecting lug 12 (base film 13), and the hot-melt adhesive layer 22 is formed between the ends of the conductive layers 17 and the fringe of the base film 13. Thus, there is no possibility that the conductive layers 17 peel off at their ends.

As described above, the present invention pertains to the connecting structure of the terminal area of a printed circuit board having a first terminal area consisting of filmy conductive layers, the printed circuit board being further provided with a sheet member such as an electrode structure which has a second terminal area as consisting of filmy conductive layers to be electrically connected to the first terminal area, the sheet member being bonded to the printed circuit board with a hot-melt adhesive. This structure is characterized in that the surface of a layer as consisting of an insulating hot-melt adhesive which is not opposed to the first terminal area of the printed circuit board protrudes from the surface of the second terminal area.

By forming the first terminal area on the surface of the printed circuit board as mentioned above, the first terminal area protrudes a distance equal to its thickness from the board. Therefore, if the second terminal area formed on the sheet member and the hot-melt adhesive layer were at the same level and in the same plane, when the sheet member is bonded to the printed circuit board, the first and second terminal areas would make contact with each other with certainty, but the hot-melt adhesive layer would not come into close contact with the surface of the printed circuit board. Accordingly, the sheet member would not be bonded to the printed circuit board with certainty, thus presenting a problem about the reliability.

In contrast with this, in the novel structure, the surface of the hot-melt adhesive layer is designed to protrude from the surface of the second terminal area. Consequently, when the sheet member is bonded to the printed circuit board, the adhesive layer comes into close contact with the surface of the printed circuit board, whereby the sheet member is stuck fast to the board. If the hot-melt adhesive layer is made slightly thicker than the second terminal area, when the sheet member is pressed against the circuit board at a high temperature, the adhesive layer softens and melts. As such, the first and second terminal areas are stuck fast to each other with certainty at all times. In this way, the present invention provides a reliable connecting structure of the printed circuit terminal area.

What is claimed is:

1. A printed circuit board assembly comprising a printed circuit board having a first terminal area which is electrically connected to a sheet member having a second terminal area;

said first terminal area of said printed circuit board comprising a substrate having a plurality of spaced-apart first terminals formed thereon;

said second terminal area comprising a plurality of spaced-apart second terminals corresponding to said first terminals formed on said sheet member, said second terminals each including a first layer of an electrically conductive material and a second layer of an electrically conductive hot-melt adhesive, and the spaces around said second terminals having a layer of electrically insulating hot-melt adhesive formed to a thickness greater than the thickness of said second terminals such that the surface of said insulating layer protrudes above the surface of said second terminals; and said first and second terminal areas being electrically connected and bonded together by said hot-melt adhesives, wherein said electrically conductive adhesive layer of said second terminals are bonded in registration with said first terminals, and said electrically insulating adhesive layer in the spaces around said second terminals being bonded to said substrate of said printed circuit board in the spaces around said first terminals.

2. A printed circuit board assembly as set forth in claim 1, wherein said substrate of said printed circuit board is made from an insulating material containing silicon dioxide, and wherein said electrically insulating adhesive layer of said sheet member contains a compound that imparts hydrophobicity to the surface of said substrate by chemically coupling with the oxygen of the silanol groups on the substrate surface.

3. A printed circuit board assembly as set forth in claim 2, wherein the compound that imparts hydrophobicity is a metal salt selected from the group consisting of nickel chloride and ammonium molybdate.

4. A printed circuit board assembly as set forth in claim 2, wherein the compound that imparts hydrophobicity is a coupling agent which contains silane.

5. A printed circuit board assembly as set forth in claim 2, wherein the compound that imparts hydrophobicity is an isocyanate compound.

6. A printed circuit board assembly as set forth in claim 2, wherein the compound that imparts hydrophobicity is a Lewis base.

7. A printed circuit board assembly as set forth in claim 1, wherein said first layer of electrically conductive material consists of a thin film of silver and a thin film of carbon formed on the silver film.

8. A printed circuit board assembly as set forth in claim 1, wherein said electrically insulating adhesive layer is formed on two sides around said second terminal area.

9. A printed circuit board assembly as set forth in claim 1, wherein an end of said second terminal area does not extend to an end of said sheet member, and said electrically insulating adhesive layer is formed between the ends of said second terminal area and said sheet member.

10. A printed circuit board assembly as set forth in claim 1, wherein said second terminal area of said sheet member is formed by a base film of polyester, said electrically insulating adhesive layer formed on said base film and made of a hot-melt adhesive that includes a chloroprene rubber and a high-molecular thermoplastic coupling agent of polyester, said first layer of electrically conductive material formed on said base film, said second layer of electrically conductive hot-melt adhesive formed on said first layer so as to extend around the sides of said first layer to said base film, and said second layer containing electrically conductive fine particles and a high-molecular thermoplastic coupling agent of polyester.

11. A printed circuit board assembly as set forth in claim 1, further comprising an electrically insulative and elastic protective film formed on a portion of said first and second terminal areas which is subject to flexing, said protective film being made of a rubber-like synthetic resin such as silicone elastomer.

12. A printed circuit board assembly as set forth in claim 11, wherein said protective film is formed as a continuous layer over the surface of said portion of said first and second terminal areas and extending to a portion of said printed circuit board beyond said first terminal area.

* * * * *